United States Patent [19]

Yanagihara et al.

[11] Patent Number: 4,516,078
[45] Date of Patent: May 7, 1985

[54] VARIABLE FREQUENCY PASSBAND CIRCUIT

[75] Inventors: Masaki Yanagihara; Takashi Iimura, both of Tokyo, Japan

[73] Assignee: Trio Kabushiki Kaisha, Japan

[21] Appl. No.: 463,848

[22] Filed: Feb. 4, 1983

[30] Foreign Application Priority Data

Feb. 15, 1982 [JP] Japan .............................. 57-18587[U]

[51] Int. Cl.³ .................... H03H 11/02; H03H 11/04
[52] U.S. Cl. .................... 328/167; 455/296; 455/26; 307/540; 307/543; 328/138; 328/165
[58] Field of Search .................... 328/165, 167, 138; 455/63, 67, 296; 307/543, 542, 540; 333/174

[56] References Cited

U.S. PATENT DOCUMENTS

| | | | |
|---|---|---|---|
| 2,998,517 | 8/1961 | Beckerich | 250/20 |
| 4,267,605 | 5/1981 | Matsuzawa et al. | 455/266 |
| 4,310,803 | 1/1982 | Kurihara et al. | 328/167 |
| 4,357,549 | 11/1982 | Miller | 307/523 |

Primary Examiner—Stanley D. Miller
Assistant Examiner—R. Roseen
Attorney, Agent, or Firm—Murray, Whisenhunt & Ferguson

[57] ABSTRACT

A variable frequency passband circuit comprising two passband filters and three mixers (front, intermediate and output mixers) connected in a cascade fashion disposed in a signal path. Two VCOs inject frequency signals into the front mixer and the output mixer. The two VCOs are respectively controlled by control signals at two potentiometers through transfer switching means so that the synthetic passband of the filter may be varied. One potentiometer suppresses the higher frequency region of a baseband signal and the other potentiometer suppresses the lower frequency region of the base band signal, irrespective of USB or LSB receiving mode.

1 Claim, 6 Drawing Figures

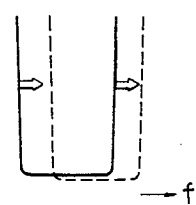
FIG. 1A
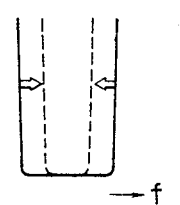
FIG. 1B
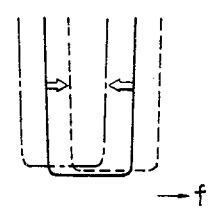
FIG. 1C
FIG. 2
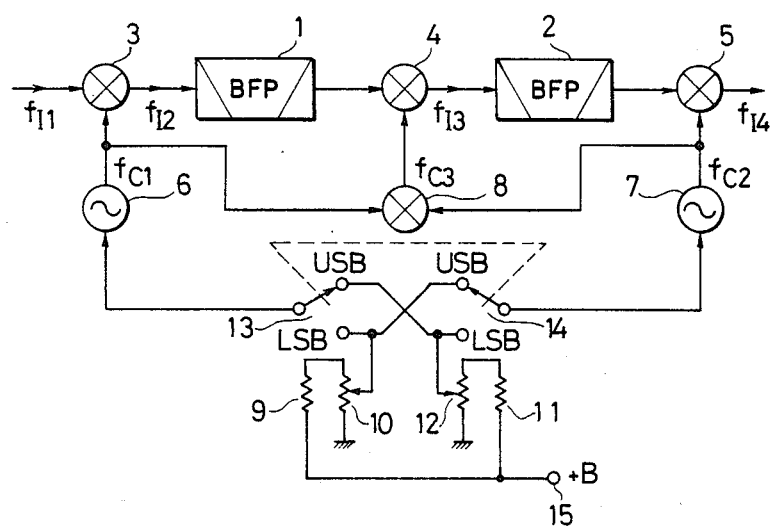
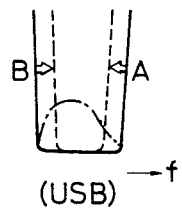
FIG. 3A
(USB)
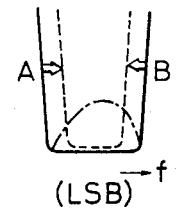
FIG. 3B
(LSB)

VARIABLE FREQUENCY PASSBAND CIRCUIT

BACKGROUND OF THE INVENTION

1. Field of the Invention

The present invention relates to variable frequency passband circuits, for example, a circuit for varying the bandwidth of an intermediate frequency amplifier stage in communication receivers.

2. Description of the Prior Art

Conventional variable passband circuits used for preventing radio-interference in communication receivers can be classified into the following three types. (1) As shown in FIG. 1A, the frequency passband of a filter is shifted from the continuous line curve to the dotted line curve without varying its bandwidth. (2) As shown in FIG. 1B, the frequency passband of a filter is narrowed at the both sides from a continuous line curve to a dotted line curve without changing its center frequency. (3) As shown in FIG. 1C, the upper side of the frequency passband of a filter is defined by the alternate long and short dash line curve which can be shifted and the lower side of the frequency passband by the dotted line curve which can be shifted.

However, in a receiver which receives SSB (Single Side Band Suppressed Carrier) signals through either of the above mentioned variable passband circuits, the operation is accompanied with some disadvantages. In the type of variable passband circuit of FIG. 1A, the attenuation characteristic of the baseband signal of SSB is reverse in upper sideband (USB) receiving mode and lower sideband (LSB) receiving mode. This requires skillful operation. In the type of variable passband circuit of FIG. 1B, since both upper and lower sides of the passband are simultaneously narrowed, there is a possibility that a desired signal itself is rejected. To overcome this disadvantage, the combination of passband variation manners of FIGS. 1A and 1B is proposed. A skillful operation, however, is still required. The manner of FIG. 1C has the same disadvantage as the manner of FIG. 1A.

SUMMARY OF THE INVENTION

It is accordingly an object of the present invention to provide a variable frequency passband circuit which obviates the above mentioned disadvantages of prior art and then has an easy operation or handling in varying the frequency passband.

In accomplishing the above and other objects, there has been provided in accordance with the present invention, a variable passband circuit which comprises first and second bandpass filters connected in a cascade fashion for forming a synthetic filter in a signal path, first and second oscillators for respectively generating first and second frequency signals which can be varied by control signals applied thereto, first and second control means for respectively producing the control signals to be applied to the first and second oscillators, a first mixer for mixing the first and second frequency signals to produce a third frequency signal in a frequency conversion, a second mixer for mixing an input signal and the first frequency signal to produce a first frequency-converted intermediate signal which is applied to the first bandpass filter, a third mixer for mixing an output signal of the first bandpass filter and the third frequency signal to produce a second frequency-converted intermediate signal which is applied to the second bandpass filter, a fourth mixer for mixing an output of the second bandpass filter and the second frequency signal to produce a third frequency-converted signal which is regarded as an output of the variable passband circuit, and switching means for connecting the first control means to the first oscillator and also the second control means to the second oscillator in a first operation mode, and alternatively connecting the first control means to the second oscillator and also the second control means to the first oscillator in a second operation mode.

The invention, and its objects and advantages, will become more apparent in the detailed description of a preferred embodiment presented below.

BRIEF DESCRIPTION OF THE DRAWINGS

In the detailed description of a preferred embodiment of the invention presented below, reference is made to the accompanying drawings in which:

FIGS. 1A–1C show passband curves varied through prior art variable passband circuits.

FIG. 2 is a schematic block diagram of a variable frequency passband circuit according to the present invention.

FIGS. 3A and 3B are frequency passband curves varied through the circuit of FIG. 2.

DESCRIPTION OF A PREFERRED EMBODIMENT

Referring to the drawing of FIG. 2, a variable frequency passband circuit according to the invention as a preferred embodiment is shown. In a signal path, there are provided front mixer 3 as a heterodyne down-converter, bandpass filter 1, intermediate mixer 4 as a heterodyne up-converter, bandpass filter 2 and output mixer 5 as a heterodyne down-converter in a cascade connection. And also, voltage controlled oscillator (VCO) 6 injects its output frequency signal into mixer 3, voltage controlled oscillator (VCO) 7 injects its output frequency signal into mixer 5 and mixer 8 mixes the output frequency signals of VCO 6 and VCO 7 to produce an up-converted frequency signal which is applied to mixer 4. A voltage control arrangement comprising two transfer-switches 13 and 14 and two potentiometers, one consisting of resistor 9 and variable resistor 10 and the other resistor 11 and variable resistor 12, which provides VCO 6 and VCO 7 with control voltages. The control voltages respectively determine the oscillation frequencies of VCO 6 and VCO 7. The transfer switches 13 and 14 are jointly switched between an upper sideband (USB) receiving mode and a lower sideband (LSB) receiving mode. DC voltage +B is applied at terminal 15. Control voltages produced at the two potentiometers are applied to VCO 6 and VCO 7 through transfer-switches 13 and 14 which are set up according to USB or LSB receiving mode.

Now, taking the carrier-center frequency of an intermediate frequency signal to be applied mixer 3 as $f_{I1}$, the carrier-center frequencies of output intermediate frequency signals of mixers 3, 4 and 5 as $f_{I2}$, $f_{I3}$ and $f_{I4}$, respectively, the oscillation frequencies of VCO 6 and VCO 7 as $f_{C1}$ and $f_{C2}$, respectively, and the output frequency of mixer 8 as $f_{C3}$, the following equations (1)–(4) are established in the circuit of FIG. 2.

$$f_{I2} = f_{I1} - f_{C1} \tag{1}$$

$$f_{I3} = f_{I2} + f_{C3} \tag{2}$$

$$f_{I4} = f_{I3} - f_{C2} \quad (3)$$

$$f_{C3} = f_{C1} + f_{C2} \quad (4)$$

From the above equations (1)–(4), output frequency $f_{I4}$ of mixer 5, that is the output frequency of the variable frequency passband circuit, is expressed as $$\begin{aligned} f_{I4} &= f_{I2} + f_{C3} - f_{C2} \\ &= f_{I1} - f_{C1} + f_{C1} + f_{C2} - f_{C2} = f_{I1}. \end{aligned} \quad (5)$$

Equation (5) means that the output frequency of the circuit, that is carrier-center frequency $f_{I4}$ of mixer 5, is equal to carrier-center frequency $f_{I1}$ of the intermediate frequency of an input signal applied mixer 3, irrespective of oscillation frequencies $f_{C1}$ and $f_{C2}$ of VCO 6 and VCO 7.

When oscillation frequency $f_{C1}$ of VCO 6 is raised by $\Delta f_{C1}$, carrier-center frequency $f_{I2}$ is shifted by $\Delta f_{C1}$ downward in frequency. Viewing this frequency shift of $f_{I2}$ from the output side of filter 1, it can be relatively regarded that the passband of filter 1 is shifted by $\Delta f_{C1}$ upward in frequency, although the passband of filter 1 is actually fixed. The change of $\Delta f_{C1}$ and VCO 6 causes output frequency $f_{C3}$ of mixer 8 to be raised by $\Delta f_{C1}$. The intermediate carrier-center frequency $f_{I3}$ can be calculated as below.

$$\begin{aligned} f_{I3} &= (f_{I2} - \Delta f_{C1}) + (f_{C3} + \Delta f_{C1}) \\ &= f_{I2} + f_{C3} \end{aligned}$$

Accordingly, even if the output frequency $f_{C1}$ of VCO 6 is changed upward or downward in frequency, the intermediate carrier-center frequency $f_{I3}$ is unchanged. That is, the relative position between $f_{I3}$ and the passband of filter 2 is not changed by the change of output frequency in VCO 6 so that only the lower side curve of the synthetic passband may be shifted. When the oscillation frequency $f_{C2}$ of VCO 7 is raised by $\Delta f_{C2}$ and then the output frequency $f_{C3}$ of mixer 8 is raised by $\Delta f_{C2}$, it can be regarded that the passband of filter 2 is shifted by $\Delta f_{C2}$ downward in frequency because $f_{I3}$ is by $\Delta f_{C2}$ upward in frequency. The intermediate carrier-center frequency $f_{I4}$ can be calculated as below.

$$\begin{aligned} f_{I4} &= (f_{I3} + \Delta f_{C2}) - (f_{C2} + \Delta f_{C2}) \\ &= f_{I3} - f_{C2} \end{aligned}$$

That is, $f_{I4}$ is unchanged. Now, assuming that the synthetic band-width of filters 1 and 2 is $f_{BW}$, when the oscillation frequencies of VCO 6 and VCO 7 are changed in the above mentioned manner, the synthetic bandwidth is narrowed into $f_{BW} - (\Delta f_{C1} + \Delta f_{C2})$ by being equivalently reduced at the lower side of $f_{BW}$ by $\Delta f_{C1}$ and at the upper side of $f_{BW}$ by $\Delta f_{C2}$.

In the upper sideband (USB) receiving mode where the transfer terminals of switches 13 and 14 are connected to USB terminals as presently set up in FIG. 2, the oscillation frequency of VCO 6 is determined by a voltage produced at one potentiometer consisting of resistor 11 and variable resistor 12, and the oscillation frequency of VCO 7 by a voltage produced at the other potentiometer consisting of resistor 9 and variable resistor 10. Where an operator adjusts the setting position of variable resistor 12 so as to raise oscillation frequency $f_{C1}$ of VCO 6 by $\Delta f_{C1}$, the synthetic passband of the circuit can be narrowed at the lower side thereof in the direction of arrow A as shown in FIG. 3A. Where the operator adjusts the setting of variable resistor 10 so as to raise oscillation frequency $f_{C2}$ by $\Delta f_{C2}$, the synthetic passband of the circuit can be narrowed at the upper side in the direction of arrow B as shown in FIG. 3A. In the USB receiving mode, the baseband signal (message signal) of an upper sideband which is shown as an alternate long and short dash line curve 5 is rejected or suppressed at the lower frequency region by adjusting the potentiometer of variable resistor 12 so as to raise oscillation frequency $f_{C1}$ of VCO 6 and at the higher frequency region by adjusting the potentiometer of variable resistor 10 so as to raise oscillation frequency $f_{C2}$ of VCO 7.

In the LSB receiving mode, the transfer terminals of switches 13 and 14 are connected to LSB terminals so that VCO 6 may be controlled by variable resistor 10 and VCO 7 by variable resistor 12. The baseband signal of a lower sideband which is shown as an alternate long and short dash line curve of FIG. 3B, which is the reversal of that of FIG. 3A, is rejected or suppressed at the higher frequency region due to the narrowing of the synthetic passband shown as arrow A in FIG. 3B by adjusting the potentiometer of variable resistor 10 so as to raise oscillation frequency $f_{C1}$ of VCO 6 and at the lower frequency region due to the narrowing of the synthetic passband as shown arrow B in FIG. 3B by adjusting the potentiometer of variable resistor 12 so as to raise oscillation frequency $f_{C2}$ of VCO 7.

From the above, it will be understood that, irrespective of the receiving mode (USB or LSB), the synthetic passband is narrowed in such a manner that the baseband signal of SSB is controllably suppressed at the higher frequency region by adjusting one potentiometer consisting of resistor 9 and variable resistor 10 at the lower frequency region by adjusting the other potentiometer consisting of resistor 11 and variable resistor 12. That is, in either of USB·or LSB receiving mode the higher frequency region suppression of a baseband signal is always controlled by the adjustment of the same one potentiometer and the lower frequency region suppression of a baseband signal is always controlled by the adjustment of the same the other potentiometer. Accordingly, the operationability is elevated and the special skill is not required so that even beginners can easily operate the variable frequency passband circuit to prevent radio-interference.

The resistance values of resistors 8 and 11 determine the maximum variation of a synthetic passband—width of FIGS. 3A and 3B. Generally speaking, it is preferable from a listening point of view that the suppression of the higher frequency region of a sound signal is larger than that of the lower frequency region thereof. The resistance values of resistors 9 and 11 can be selected so as to meet the above requirement.

In the circuit of FIG. 2, mixers 3 and 5 have been described as heterodyne frequency down—convertors which produce the difference of two input frequencies. In another embodiment, mixers 3 and 5 can be heterodyne frequency up—convertors which produce the sum of two input frequencies.

In the variable frequency passband circuit according to the present invention, the upper and lower sides of a synthetic passband are independently set up, and also the higher and lower frequency regions of a baseband signal of SSB are controllably suppressed by the same potentiometer, even where the receiving mode is switched from USB to LSB and vice versa. This brings a simple structure, as well as the operability.

It is to be understood that the embodiment described herein is merely illustrative of the principles of the invention. A variety of modification thereto may be effected by persons skilled in the art without departing from the spirit and scope of the invention.

We claim:

1. A variable frequency passband circuit comprising:

first and second bandpass filters (e.g., 1, 2) connected in a cascade fashion for forming a synthetic filter in a signal path, first and second oscillators (e.g., 6, 7) for respectively generating first and second frequency signals (e.g., $f_{C1}$, $f_{C2}$) which can be varied by control signals applied thereto, first and second control means (e.g., 11, 12; 9, 10) for respectively producing said control signals to be applied to said first and second oscillators, a frequency signal generator (e.g., 8) for mixing said first and second frequency signals to produce a third frequency signal (e.g., $f_{C3}$), a first mixer (e.g., 3) for mixing an input signal (e.g., $f_{I1}$) to be applied to the circuit and said first frequency signal to produce a signal which is applied to said first bandpass filter, a second mixer (e.g., 4) for mixing an output signal of said first bandpass filter and said third frequency signal to produce a second frequency—converted input signal which is applied to said second bandpass filter, a third mixer (e.g., 5) for mixing an output of said second bandpass filter to produce a signal output of the circuit, and switching means (e.g., 113, 14) for connecting said first control means to said first oscillator and also said second control means to said second oscillator in a first operation mode, and alternatively connecting said first control means to said second oscillator and also said second control means to said first oscillator in a second operation mode.

* * * * *